(12) United States Patent
Lin

(10) Patent No.: US 6,225,137 B1
(45) Date of Patent: May 1, 2001

(54) SEMICONDUCTOR WAFER EVALUATION METHOD

(75) Inventor: Liu Guo Lin, Higashi Yamato (JP)

(73) Assignee: Oki Electric Industry Co., Ltd.

( * ) Notice: Subject to any disclaimer, the term of this patent is extended or adjusted under 35 U.S.C. 154(b) by 0 days.

(21) Appl. No.: 09/612,436

(22) Filed: Jul. 7, 2000

(30) Foreign Application Priority Data

Mar. 21, 2000 (JP) .................................................. 00-078235

(51) Int. Cl.⁷ ............................ H01L 21/66; G01R 31/26
(52) U.S. Cl. ................................ 438/14; 438/14; 438/17; 148/DIG. 162
(58) Field of Search ............................... 438/14, 17, 407, 438/423, 480, 766, FOR 158, FOR 122; 148/DIG. 12, DIG. 162

(56) References Cited

FOREIGN PATENT DOCUMENTS

2000031255  *  1/2000  (JP) .

* cited by examiner

Primary Examiner—Charles Bowers
Assistant Examiner—Asok K. Sarkar
(74) Attorney, Agent, or Firm—Rabin & Champagne, P.C.

(57) ABSTRACT

The semiconductor wafer evaluation method of the present invention comprises the steps of: preparing a substrate embedded with an oxide film; removing the oxide film from a surface of the substrate so as to expose a silicon layer; removing silicon portions within the silicon film and the embedded oxide film by etching so as to form holes within the embedded oxide layer in a first etching step; removing the silicon substrate below the holes by etching in a second etching step; and measuring and evaluating the holes enlarged by the first and second etching steps.

20 Claims, 5 Drawing Sheets

SEMICONDUCTOR WAFER EVALUATION METHOD

BACKGROUND OF THE INVENTION

The present invention relates to a method for evaluating a semiconductor wafer, and more particularly relates to a method for evaluating a semiconductor wafer where pinholes in an oxide film embedded in an SOI (Silicon On Insulator) wafer are measured and evaluated.

Semiconductor wafers having an SOI structure (hereinafter referred to as "SOI wafers") have attracted great attention due to their anticipated high device integration, low power consumption and high-speed. Typical SOI wafers are a bonded type and a SIMOX (Separation by Implanted Oxygen) type. With SIMOX type SOI wafers, oxygen is not injected into the wafer due to the influence of particles attached to the wafer surface during oxygen ion implantation when making the wafer, and parts of the silicon therefore remain within the embedded oxide film. The embedded oxide film is therefore not formed, with portions where the silicon remains being referred to as pinholes. The presence of a pinhole can cause the embedded oxide film withstand voltage to be deficient, and is a direct cause of falls in the device yield. Evaluation of pinhole defects is defined in specification "SOI Wafer Standards Specification JEIDA-50-1997" published by JEIDA as one aspect of SOI wafer quality management.

The corporate body of the Japan Electronic Industrial Development Association (JEIDA) endorses a Cu detection method (Cu decoration method) and a MOS capacitor method as pinhole defect evaluation methods. In the Cu detection method, Cu is deposited on an SOI layer on top of the pinholes of weak insulating properties by electrolysis employing a $CuSO_4$ solution and the Cu deposits are then measured using a microscope to obtain the pinhole density of the embedded oxide film. In the MOS capacitor method, a MOS capacitor is formed on the SOI wafer, and the defective capacitor rate is obtained by measuring the withstand voltage characteristic value. There is also another method of calculating pinhole density of an embedded oxide film using MOS capacitor electrode surface area and defective-capacitor rate.

However, with the Cu detection method, an electrolyzer is necessary for handling the Cu solvent etc., but introduction in semiconductor factories and research establishments has been difficult due to the fear of devices becoming contaminated with Cu. The precision of the MOS capacitor method as an evaluation method is high, but it is necessary to form devices on the wafer. In any of these methods, preparation until wafer evaluation is implemented requires a substantial amount of time.

SUMMARY OF THE INVENTION

Implementation of a semiconductor evaluation method capable of easily counting and evaluating pinholes within an embedded oxide film of a SIMOX type SOI wafer is therefore desired.

The semiconductor wafer evaluation method of the present invention therefore comprises the steps of: preparing a substrate embedded with an oxide film; removing the oxide film from a surface of the substrate so as to expose a silicon layer; removing silicon portions within the silicon film and the embedded oxide film by etching so as to form holes within the embedded oxide layer in a first etching step; removing the silicon below the holes by etching in a second etching step; and measuring and evaluating the holes enlarged by the first and second etching steps.

BRIEF DESCRIPTION OF THE DRAWINGS

While the specification concludes with claims particularly pointing out and distinctly claiming the subject matter which is regarded as the invention, it is believed that the objects, features of the invention and further objects, features and advantages thereof will be better understood from the following description taken in connection with the accompanying drawings in which:

DESCRIPTION OF THE PREFERRED EMBODIMENTS

First Embodiment

Figure 1:
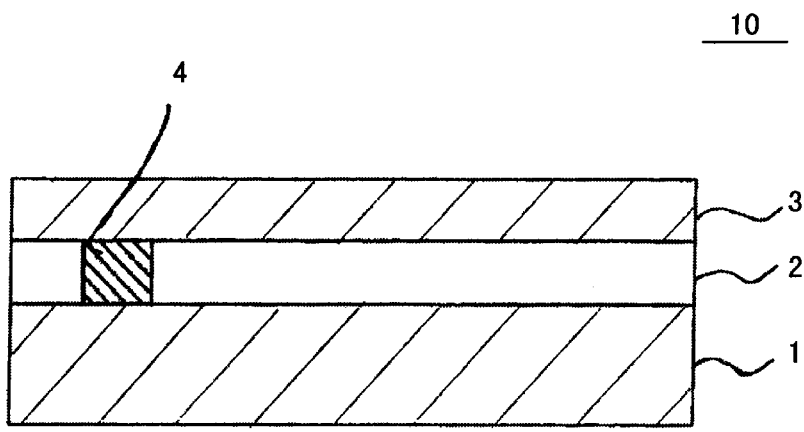
FIG. 1 is a view illustrating a first embodiment of the present invention.
Figure 1:
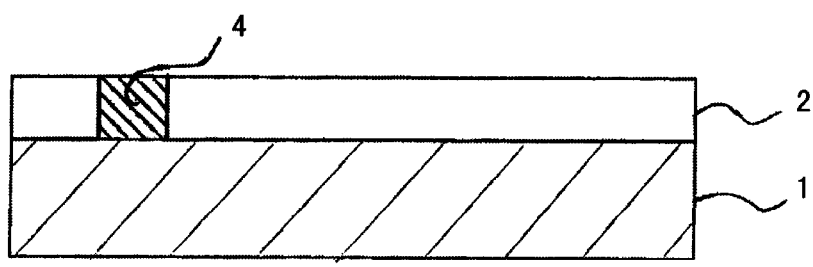
Figure 1:
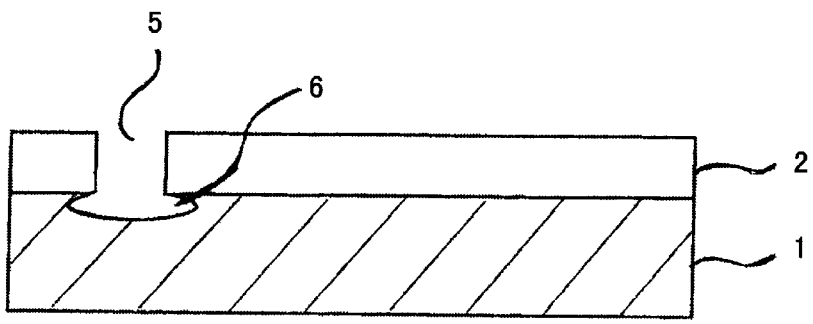

FIG. 1(a) to FIG. 1(c) are views illustrating a first embodiment of the present invention.

(1) First Step

A SIMOX type SOI wafer is prepared. A SIMOX type SOI wafer 10 is configured with an SOI layer 3/BOX oxide film 2/silicon substrate 1-structure as a result of forming an embedded oxide film (BOX oxide film) 2 within a silicon substrate 1. A pinhole 4 is present within the BOX oxide film 2. The pinhole 4 is a portion of the silicon substrate 1 which is not subjected to oxidation where silicon (Si) remains within the BOX oxide film 2 and is shown in FIG. 1(a).

(2) Second Step

The SOI layer 3 is removed by etching. Oxide film (not shown) that was already on the surface of the SOI layer 3 had already been removed, although this has been omitted from the detailed description. An alkali etching solvent with a concentration of aqueous ammonia of 5 to 39% (hereinafter referred to as $NH_4OH$ solvent) is used as the etching solvent at this time. Specifically, referring to FIG. 1(b), the SOI layer 3 is removed by immersing the SOI wafer 10 in $NH_4OH$ solvent, or by spraying the SOI wafer 10 with atomized $NH_4OH$ solvent.

(3) Third Step

After the SOI layer 3 is removed in the second step, etching is continued using $NH_4OH$ solvent and the silicon within the pinhole 4 within the BOX oxide film 2 is removed. The pinhole 4 after the removal of the silicon will be referred to as pinhole 5 for ease of understanding. At this time, the etching ratio of the $NH_4OH$ solvent is much larger for the silicon (Si) compared with the silicon oxide film ($SiO_2$) taken as the BOX oxide film 2. The BOX oxide film 2 is therefore not etched but the silicon substrate 1 below the pinhole 5 is over-etched. The pinhole 5 is therefore enlarged as a result of including an over-etched portion 6. The over-etched portion 6 becomes larger if the extent of over-etching is increased but the shape and size of the pinhole 5 does not change, as shown in FIG. 1(c).

(4) Fourth Step

The number of pinholes is counted and coordinate information is detected using a particle detector. The pinholes 5 are holes and can therefore be detected by a particle detector in the same manner that particles and defects are detected.

Coordinate information can be detected with great ease for the pinholes 5 as a result of the pinholes 5 being enlarged by over-etching.

(5) Fifth step

Finally, the pinholes 5 are observed using coordinate information obtained in the fourth step. The pinholes 5 are observed using, for example, a Scanning Electron Microscope (SEM) so as to evaluate the shapes and sizes etc. of the pinholes.

According to the first embodiment of the present invention, detection of the number of pinholes and coordinate information for the pinholes is possible using a particle detector because silicon within the pinholes is removed and the pinholes are made into hole shapes, with the silicon layer below the pinholes then being subjected to over-etching. This means that an extremely effective semiconductor wafer evaluation method can be implemented in a short time.

Second Embodiment

Figure 2:
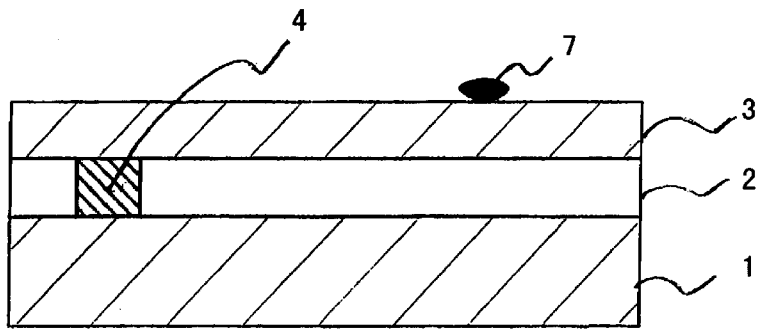
FIG. 2 is a view illustrating a second embodiment of the present invention.
Figure 2:
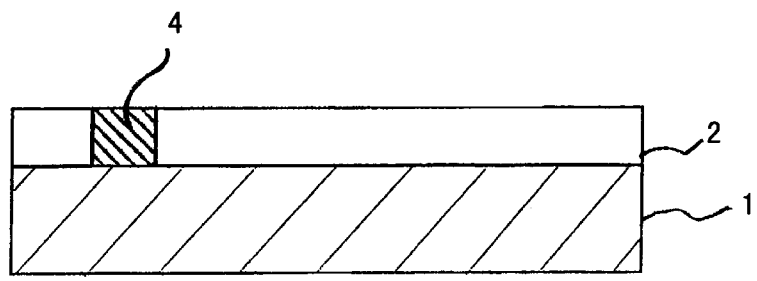
Figure 2:
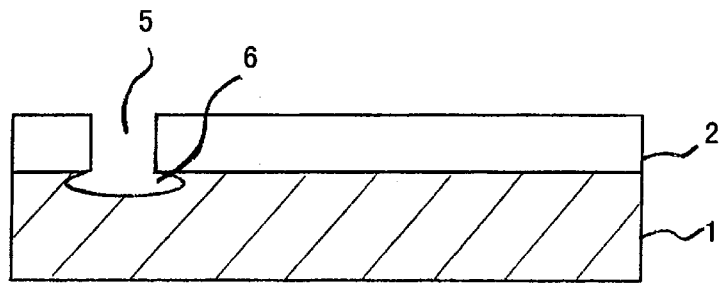

FIG. 2(a) to FIG. 2(c) are views illustrating a second embodiment of the present invention. The point of distinction with the first embodiment is the second step. In this embodiment, the SOI layer 3 is removed by Chemical-Mechanical Polishing. Aspects of the configuration of the second embodiment that are the same as for the first embodiment are given the same numerals and their detailed description is omitted. The third and fourth steps are the same as for the first embodiment and a detailed description thereof is omitted.

(1) First Step

A SIMOX type SOI wafer is prepared. A SIMOX type SOI wafer 20 is configured with an SOI layer 3/BOX oxide film 2/silicon substrate 1-structure as a result of forming an embedded oxide film (BOX oxide film) 2 within a silicon substrate 1. A pinhole 4 is present within the BOX oxide film 2. The pinhole 4 is a portion of the silicon substrate 1 which is not subjected to oxidation where silicon remains within the BOX oxide film 2. A particle 7 also exists at the surface of the SOI wafer 20 (refer to FIG. 2(a)).

(2) Second Step

The SOI layer 3 is removed by CMP. At this time, oxide film (not shown) at the surface of the SOI layer 3 is simultaneously removed. When the SOI layer 3 is removed by etching, parts of the SOI layer 3 remain because of the particle 7 at the surface of the SOI wafer 20. If the CMP method is employed, particles 7 at the surface of the SOI wafer 20 can also be removed at the same time as the SOI layer 3 and none of the SOI layer 3 then remains after etching due to the particle 7. In other words, referring to FIG. 2(b) and FIG. 2(c), recesses and protrusions other than the pinholes 5 are therefore not formed after the third step (a description of the third step is omitted here).

A further monitoring step employing SEM is then no longer necessary because just the holes of the pinhole 5 can be measured using a particle detector.

According to a second embodiment of the present invention, a semiconductor wafer evaluation method can be proposed where a monitoring step employing SEM etc. (the fifth step of the first embodiment) can be omitted by carrying out removal of the SOI layer using a CMP method.

Third Embodiment

Figure 3:
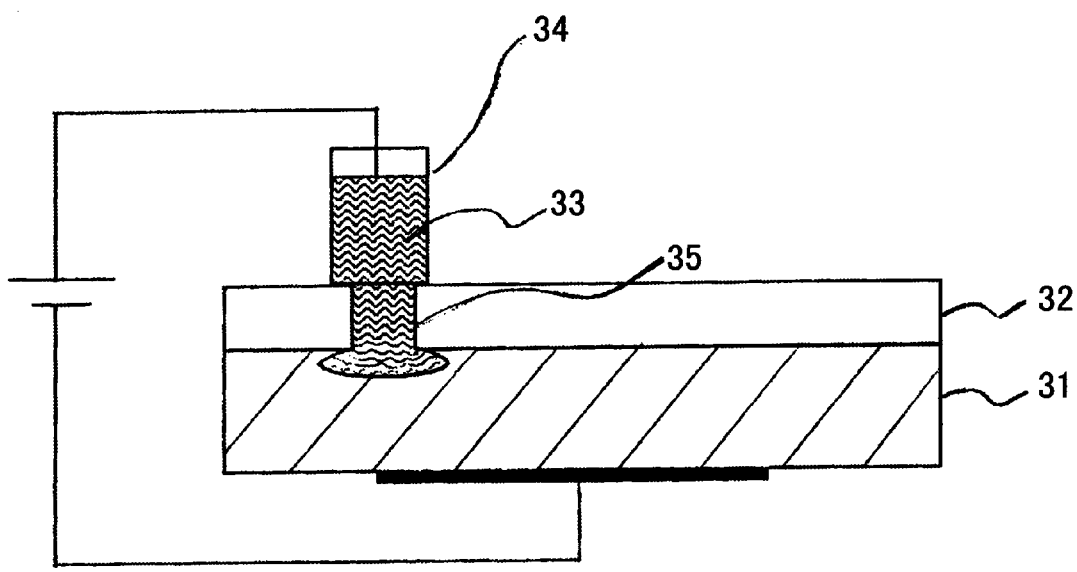
FIG. 3 is a view illustrating a third embodiment of the present invention.
Figure 4:
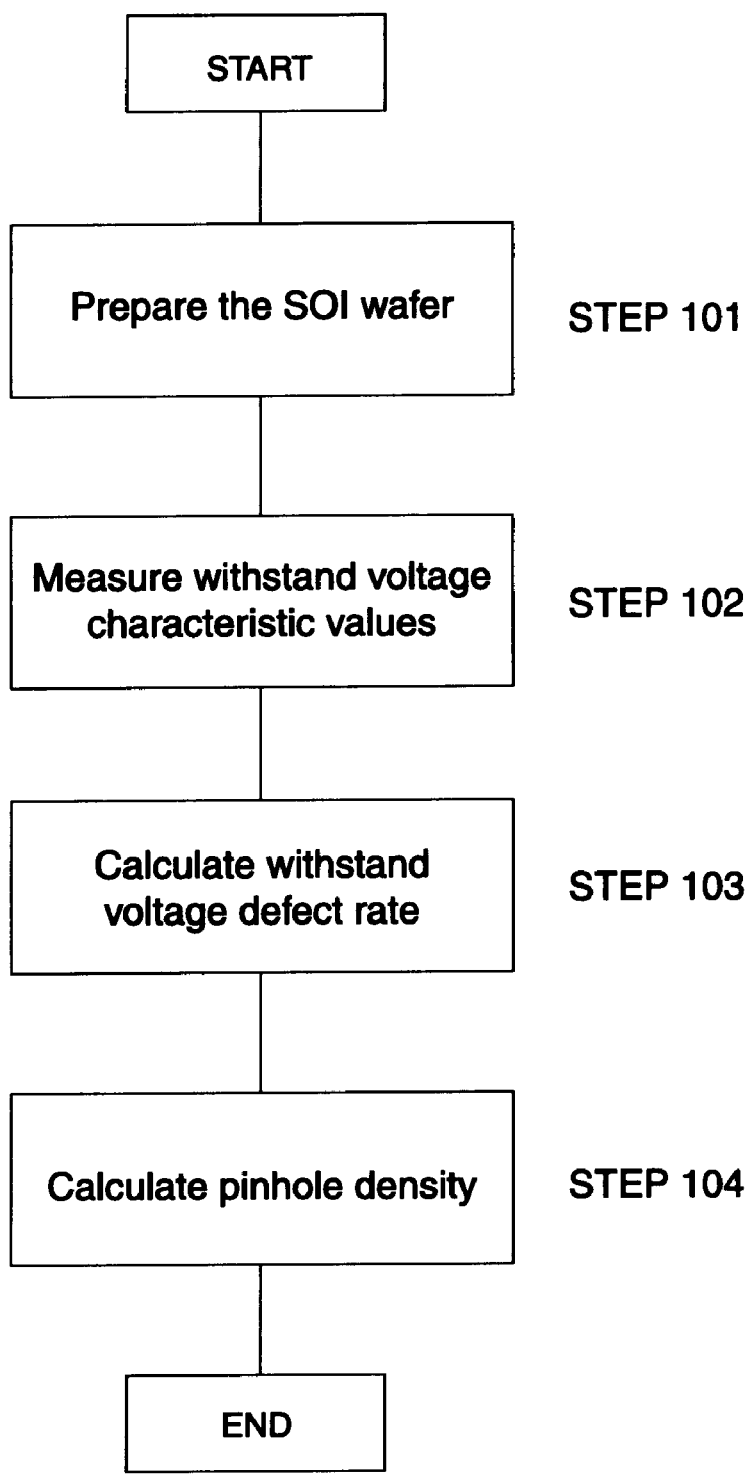
FIG. 4 is a flow chart showing the third embodiment of the present invention.

FIG. 3 is a view illustrating a third embodiment of the present invention. FIG. 4 is a flowchart showing the third embodiment of the present invention. In this embodiment, pinhole density is obtained electrically by measuring the withstand voltage characteristic using mercury probe techniques after carrying out measurement and evaluation using a particle detector or SEM.

A simple description is now given of mercury probe techniques. A mercury probe technique is a method that carries out measurements using a mercury probe 34, with this mercury probe 34 having mercury 33 at its tip in a liquid state. First, the mercury probe 34 is provided at a BOX oxide film 32 to be measured, and the mercury 33 at the tip of the mercury probe 34 is made to come into contact with the BOX oxide film 32. The mercury 33 enters the hole of the pinhole 35 of the BOX oxide film 32 and makes contact with the silicon substrate 1. As a result, the withstand voltage cannot be obtained for the pinhole 35 because there is conduction with the pinhole 35, while on the other hand, the withstand voltage can be obtained for the BOX oxide film 32 because there is no conduction with the BOX oxide film 32.

The SOI wafer 30 is prepared by implementing the same steps as in the first embodiment and second embodiment (step 101). Withstand voltage characteristic values are then measured at a few tens to a few hundreds of points on the SOI wafer 30 using mercury probe techniques (step 102). At this time, points where withstand voltage measurements cannot be made (with A mode voltage defects) are considered to be pinholes. However, it is also possible that the withstand voltage cannot be obtained because the mercury 33 makes contact with the silicon substrate 31 via the pinhole 35.

A withstand voltage defect rate f is calculated by using an A mode withstand defect number for the total number of points measured using mercury probe techniques (step 103). A density D of pinholes 35 can then be obtained using a natural logarithm e, withstand voltage defect rate f and cross-sectional area A of the mercury probe 34. The density D of pinholes 35 is given by the following equation.

$$f = 1 - e(-AD)$$

According to the third embodiment of the present invention pinholes can easily be measured and evaluated compared with related MOS capacitor techniques for measuring withstand voltage characteristic values without influencing the process during forming of the MOS capacitor.

Fourth Embodiment

Figure 5:
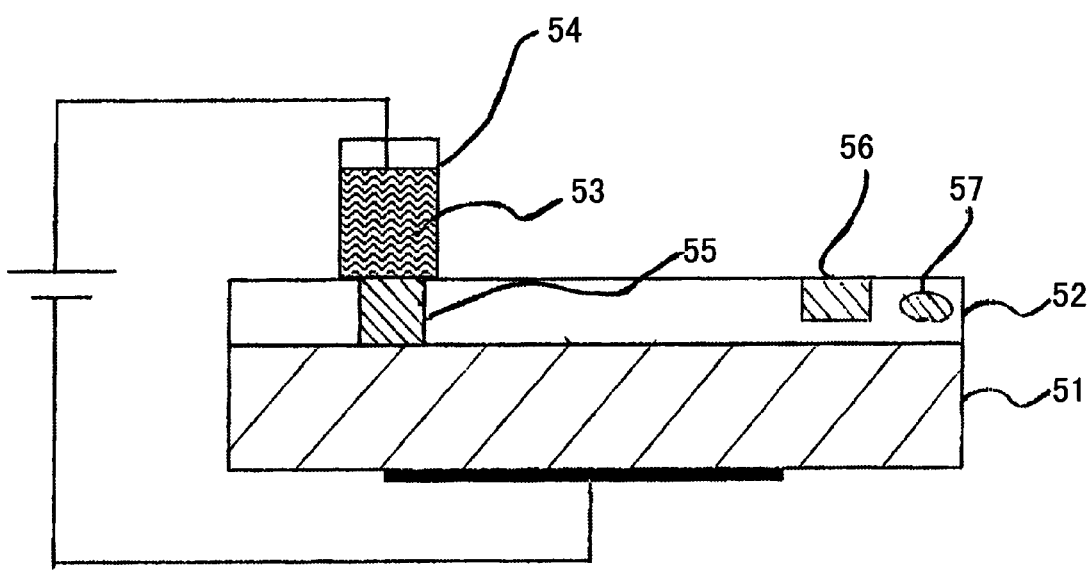
FIG. 5 is a view illustrating a fourth embodiment of the present invention.

FIG. 5 is a view illustrating a fourth embodiment of the present invention. This embodiment is characterized by preparing an SOI wafer 50 with the SOI layer removed and measuring withstand voltage characteristic values using mercury probe techniques. Withstand voltage characteristic values are then measured at a few tens to a few hundreds of points on the SOI wafer 30 using mercury probe techniques. At this time, locations where measurements cannot be taken for the withstand voltage using mercury probe techniques (withstand voltage mode defects) are taken to be pinholes, as described previously. Points where the withstand voltage characteristic value is small (B mode withstand voltage defects) and genuine damaged points (C mode withstand voltage) can be detected at the few tens to few hundred measurement points other than measurement points for the A mode withstand voltage defects. Withstand voltage characteristic distribution on the SOI wafer 50 can be obtained using these detection results. At this time, B mode withstand voltage defects are detected as pinholes 56 (including silicon islands 57) that do not pass completely through to a silicon substrate 51 and C mode withstand voltages are detected as withstand voltage characteristic values for a BOX oxide film 52.

In the fourth embodiment of the present invention, it is possible to measure and evaluate genuine withstand voltage characteristic values not just for A-mode withstand voltage impurities but also for B-mode withstand voltage defects and BOX oxide films.

In a first aspect of the invention, silicon is removed from within pinholes so as to make the pinholes hole-shaped and the silicon layer below the pinholes is subjected to over-etching. It is therefore possible to measure and evaluate pinholes within an embedded oxide film of a semiconductor wafer, and in particular, SIMOX type wafers, in an extremely effective manner and in a short time compared with related evaluation methods.

In a second aspect of the invention, pinhole density of a semiconductor wafer can be obtained by combining the first aspect of the invention with mercury probe techniques. Further, the detection of A mode withstand voltage defects indicating pinholes, the detection of B mode withstand voltage defects indicating pinholes that do not pass completely through as far as the silicon substrate, and the measuring of genuine withstand voltage characteristic values for BOX oxidation films is possible.

What is claimed is:

1. A semiconductor wafer evaluation method comprising the steps of:
   preparing a substrate embedded with an oxide film;
   removing the oxide film from a surface of the substrate so as to xpose a silicon layer;
   removing silicon portions within the silicon film and the embedded oxide film by etching so as to form holes within the embedded oxide layer in a first etching step;
   removing part of the silicon substrate below the holes by etching in a second etching step; and
   counting and evaluating the holes enlarged by the first and second etching steps.

2. The semiconductor wafer evaluation method of claim 1, wherein the first and second etching steps are carried out consecutively using the same etching solution.

3. The semiconductor wafer evaluation method of claim 2, wherein the etching solution is aqueous ammonia solvent (NH$_4$OH).

4. The semiconductor wafer evaluation method of claim 1, wherein the first and second etching steps are carried out by immersion in the same etching solution.

5. The semiconductor wafer evaluation method of claim 1, wherein the first and second etching steps are carried out by spraying with the same atomized etching solution.

6. The wafer evaluation method of claim 1, wherein the step of counting and evaluating the enlarged holes is carried out by a particle detector and using SEM.

7. The semiconductor wafer evaluation method of claim 1, wherein counting of the enlarged holes and detection of coordinate information is carried out by the particle detector; and
   the shape and size of the enlarged holes is evaluated by SEM.

8. A semiconductor wafer evaluation method wherein the semiconductor wafer evaluation method of claim 1 further comprises the steps of: measuring withstand voltage characteristic values at a prescribed number of points of a region including the enlarged holes using mercury probe techniques; and
   calculating the density of the enlarged holes of the semiconductor wafer using the measurement results.

9. A semiconductor wafer evaluation method wherein the semiconductor wafer evaluation method of claim 1 further comprises the steps of:
   measuring withstand voltage characteristic values at a prescribed number of points of a region including the enlarged holes using mercury probe techniques; and
   detecting A mode withstand voltage defects and B mode withstand voltage defects occurring within the embedded oxide film using the measuring results.

10. A semiconductor wafer evaluation method comprising the steps of:
    preparing a substrate embedded with an oxide film;
    removing the oxide film from a surface of the substrate so as to expose a silicon layer;
    carrying out polishing so as to remove the silicon layer and expose the embedded oxide film;
    removing silicon portions within the embedded oxide film so as to form holes within the embedded oxide layer in a first etching step;
    removing part of the silicon substrate below the hole by etching in a second etching step; and
    measuring and evaluating the holes enlarged by the first and second etching steps.

11. The semiconductor wafer evaluation method of claim 10, wherein the CMP techniques are employed for the polishing.

12. The semiconductor wafer evaluation method of claim 10, wherein the first and second etching steps are carried out consecutively using the same etching solution.

13. The semiconductor wafer evaluation method of claim 12, wherein the etching solution is aqueous ammonia solution.

14. The semiconductor wafer evaluation method of claim 10, wherein the first and second etching steps are carried out by immersion in the same etching solution.

15. The semiconductor wafer evaluation method of claim 10, wherein the first and second etching steps are carried out by spraying with the same atomized etching solution.

16. The wafer evaluation method of claim 10, wherein the step of measuring and evaluation the enlarged hole is carried out by a particle detector.

17. The semiconductor wafer evaluation method of claim 10, wherein counting of the enlarged holes and detection of coordinate information is carried out by the particle detector.

18. A semiconductor wafer evaluation method wherein the semiconductor wafer evaluation method of claim 10 further comprises the steps of:
    measuring withstand voltage characteristic values at a prescribed number of points of a region including the enlarged holes using mercury probe techniques; and
    calculating the density of the enlarged holes of the semiconductor wafer using the measurement results.

19. A semiconductor wafer evaluation method wherein the semiconductor wafer evaluation method of claim 10 further comprises the steps of:
    measuring withstand voltage characteristic values at a prescribed number of points of a region including the enlarged holes using mercury probe techniques; and
    detecting A mode withstand voltage defects and B mode withstand voltage defects occurring within the embedded oxide film using the measuring results.

20. A semiconductor wafer evaluation method comprising the steps of:
    preparing a substrate embedded with an oxide film;
    removing the oxide film from a surface of the substrate so as to expose a silicon layer;
    removing the silicon layer and exposing the embedded oxide film;
    measuring withstand voltage characteristic values at a prescribed number of points of a region including the enlarged holes using mercury probe techniques; and
    detecting A mode withstand voltage defects and B mode withstand voltage defects occurring within the embedded oxide film using the measuring results.

* * * * *